United States Patent
Drummond et al.

(10) Patent No.: US 6,521,099 B1
(45) Date of Patent: *Feb. 18, 2003

(54) PERIODICALLY CLEARING THIN FILM PLASMA PROCESSING SYSTEM

(75) Inventors: Geoffrey Drummond, Fort Collins, CO (US); Richard A. Scholl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/669,489

(22) Filed: Sep. 25, 2000

Related U.S. Application Data

(63) Continuation of application No. 09/245,131, filed on Jan. 22, 1999, now Pat. No. 6,217,717, which is a continuation of application No. 08/435,810, filed on May 5, 1995, now abandoned, which is a continuation of application No. 08/042,619, filed on Apr. 2, 1993, now Pat. No. 5,718,813, which is a continuation of application No. 07/998,513, filed on Dec. 30, 1992, now Pat. No. 5,427,669.

(51) Int. Cl.[7] .............................................. C23C 14/34
(52) U.S. Cl. ........................ 204/192.12; 204/192.13; 204/298.03; 204/298.08; 204/298.14
(58) Field of Search ...................... 204/192.12, 192.13, 204/298.03, 298.08, 298.14, 298.06

(56) References Cited

U.S. PATENT DOCUMENTS

| | | | |
|---|---|---|---|
| 4,046,659 A | 9/1977 | Corina et al. ................ | 204/192 |
| 4,103,324 A | 7/1978 | Vandervelden et al. | 204/298.08 |
| 4,181,541 A | 1/1980 | LeFrancois ................ | 148/16.6 |
| 4,194,930 A | 3/1980 | Tanaka et al. ............. | 148/16.6 |
| 4,396,478 A | 8/1983 | Aizenshtein et al. ... | 204/192.13 |

(List continued on next page.)

FOREIGN PATENT DOCUMENTS

| | | |
|---|---|---|
| DE | 2422808 | 5/1974 |
| DE | 3121389 | 8/1982 |
| DE | 221202 | 4/1985 |
| DE | 229160 | 10/1985 |
| DE | 3919147 A1 | 6/1989 |
| DE | 4113704 | 10/1992 |
| DE | 4127505 A1 | 2/1993 |
| DE | 4438463 C1 | 2/1996 |
| EP | 0 186 865 | 7/1986 |
| EP | 0 528 163 A1 | 2/1993 |
| EP | 0 553 410 A1 | 8/1993 |
| EP | 0564789 A1 | 10/1993 |
| EP | 0567954 | 11/1993 |

(List continued on next page.)

OTHER PUBLICATIONS

Greiner et al., "RF Sputtering Technique", IBM Technical Disclosure Bulletin, vol. 17, No. 7, pp. 2172–2173, Dec. 1974.*

(List continued on next page.)

*Primary Examiner*—Rodney G. McDonald
(74) *Attorney, Agent, or Firm*—Santangelo Law Offices, P.C.

(57) ABSTRACT

An enhanced DC plasma processing system which acts to immediately stop current from flowing through the plasma allows a variety of alternative embodiments for varying applications. In one embodiment, a tapped inductor is switched to ground to achieve substantial voltage reversal of about 10% upon detection of an arc condition through voltage and/or rate of voltage change techniques. This reversal of voltage is maintained long enough to allow restoration of uniform charge density within the plasma prior to restoration of the initial driving condition. A technique for preventing arc discharges involving periodically applying a reverse voltage is effected through a timer system in the power supply.

4 Claims, 3 Drawing Sheets

U.S. PATENT DOCUMENTS

| | | | |
|---|---|---|---|
| 4,610,775 A | 9/1986 | Phifer | 204/192.12 |
| 4,693,805 A | 9/1987 | Quazi | 204/192.22 |
| 4,710,694 A | 12/1987 | Sutphin | 320/21 |
| 4,711,767 A | 12/1987 | Diederich | 422/186 |
| 4,792,730 A | 12/1988 | Mintchev et al. | 315/209 SC |
| 4,931,169 A | 6/1990 | Scherer et al. | 204/298.11 |
| 4,936,960 A | 6/1990 | Siefkes et al. | 204/192.38 |
| 4,963,238 A | 10/1990 | Siefkes et al. | 204/192.12 |
| 4,981,566 A | 1/1991 | Wurczinger | 204/192.13 |
| 5,001,620 A | 3/1991 | Smith | 363/89 |
| 5,006,213 A | 4/1991 | Eggo Sichmann et al. | 204/192.14 |
| 5,009,764 A | 4/1991 | Siefkes et al. | 204/298.08 |
| 5,015,493 A | 5/1991 | Gruen | 427/571 |
| 5,034,973 A | 7/1991 | Ishiyama | 378/114 |
| 5,074,984 A | 12/1991 | Eggo Sichmann et al. | 204/192.14 |
| 5,108,571 A | 4/1992 | Ludwig et al. | 204/192.13 |
| 5,126,033 A | 6/1992 | Szczyrbowski et al. | 204/298.08 |
| 5,192,894 A | 3/1993 | Teschner | 204/298.08 |
| 5,212,425 A | 5/1993 | Goebel et al. | 315/111.21 |
| 5,241,152 A | 8/1993 | Anderson et al. | 219/121.57 |
| 5,281,321 A | 1/1994 | Sturmer et al. | 204/298.08 |
| 5,286,360 A | 2/1994 | Szczrbowski | 204/298.08 |
| 5,300,205 A | 4/1994 | Fritsche | 204/192.12 |
| 5,303,139 A | 4/1994 | Mark | 363/63 |
| 5,357,418 A | 10/1994 | Clavel | 363/89 |
| 5,427,669 A | 6/1995 | Drummond | 204/298.08 |
| 5,507,930 A | 4/1996 | Yamashita et al. | 204/192.15 |
| 5,576,939 A | 11/1996 | Drummond | 363/16 |
| 5,645,698 A | 7/1997 | Okano | 204/192.12 |
| 5,718,813 A | 2/1998 | Drummond et al. | 204/192.12 |

FOREIGN PATENT DOCUMENTS

| | | |
|---|---|---|
| EP | 0 591 675 A1 | 4/1994 |
| EP | 0628212 | 10/1994 |
| FR | 2 648 001 | 12/1990 |
| GB | 1134562 | 11/1968 |
| GB | 2045553 | 10/1980 |
| JP | 069324 | 4/1982 |
| JP | 5 7069-324 | 4/1982 |
| JP | 61-30665 | 2/1986 |
| JP | 0190168 | 8/1988 |
| JP | 6 3190-168 A | 8/1988 |
| JP | 1-14312 | 3/1989 |
| JP | 3-56671 | 3/1991 |
| JP | 3-61368 | 3/1991 |
| JP | 3056-671 A | 3/1991 |
| JP | 6-145973 | 5/1994 |
| WO | WO 91/15027 | 10/1991 |
| WO | WO 94/23440 | 10/1994 |

OTHER PUBLICATIONS

Economical Considerations on Modern Web Sputtering Technology; S. Beisswenger, et al.; 1992; pp. 128–134.

Electric Circuits, ISBN 0–201–06238–0, 1983, Nilsson, James, pp. 160, 161, 165.

New Method of Arc Suppression for Reactive–DC–Magnetron Sputtering; Williams, et al., pp. 1–16.

PCT search report mailed Jan. 11, 1994.

The MDX as a Strategic Tool in Reducing Arcing; Doug Schatz; 1985; pp. 1–7.

U.S. patent application Ser. No. 08/042,619 "Enhanced Reactive DC Sputtering System"; filing date: Apr. 2, 1993 (RSparc '619).

U.S. patent application Ser. No. 07/998,513, "Enhanced Thin Film DC Plasma Processing System"; filing date: Dec. 30, 1992 (Sparc Orig. US Pat 5,427,669).

"Optical Society of America Annual Meeting," 1992 Technical Digest series, vol. 23, Abstract, New Method of Arc Suppression . . . , Williams, Sep. 1992.

EXcerpts from an European patent Office action related to the parent case.

Electric Circuits, (2d ed.), "Introduction to Mesh Currents" pp. 82–149.

*The Basics of Sputtering*, Materials Research Corp., Orangeburg, New York, (3d ed. 1980), pp. 3–42.

Press Release, "New Arc–Check™ Provides Sustained Arc Control," Advanced Energy Industries, Inc., Fort Collins, CO., 1988.

"MDX–10K Series DC Magnetron Drives," Advanced Energy Industries, Inc., Fort Collins, CO., 1988.

"Arcing Problems Encountered During Sputter Deposition of Aluminum," Thomas C. Grove, Application Note Issued by Advanced Energy Industries, Inc., Fort Collins, CO 1986.

Anderson, et al., "A New Technique for Arc Control in DC Sputtering", Society of Vacuum Coasters, 35th Annual Technical Conference Proceedings (1992), pp. 325–329.

* cited by examiner

PERIODICALLY CLEARING THIN FILM PLASMA PROCESSING SYSTEM

This is a continuation of U.S. application Ser. No. 09/245,131, filed Jan. 22, 1999, now U.S. Pat. No. 6,217,717 which is a continuation of U.S. application Ser. No. 08/435,810, filed May 5, 1995 now abandoned which is a continuation of U.S. application Ser. No. 07/998,513 filed on Dec. 30, 1992, now U.S. Pat. No. 5,427,669 and Ser. No. 08/435,810 is a continuation of U.S. application Ser. No. 08/042,619, filed Apr. 2, 1993, now U.S. Pat. No. 5,718,813, each hereby incorporated by reference.

BACKGROUND OF THE INVENTION

This invention generally relates to thin film processing systems in which a plasma effects either etching, deposition, or some other process. Specifically, the invention has application to DC plasma processing when coating with metallic materials or with materials formed by chemical reaction in the coating process. It also involves power supply designs used in such applications.

The field of DC plasma processing for thin film applications is one which is well known. In these processes, a DC power supply creates an electric potential between a cathode and anode and thereby creates a plasma. In the deposition mode, the plasma then acts upon a material target to create a thin film on some substrate. This thin film may either be comprised of the target material itself or may be the result of some reaction with some element within the coating chamber. Naturally both the materials and elements involved and the specific applications vary greatly. Applications may range from coating architectural glass to the creation of micro chips. One of the challenges in many applications is that electrical discharges or arcs can occur. This is particularly true when reactive processes are used and the reactive product is an insulator, such as aluminum oxide ($Al_2O_3$). As one example, this type of coating process is particularly challenging because it involves both conductive and insulating regions. As a result, the electrical environment during plasma processing itself can be particularly conductive to arc discharges. These arc discharges are undesirable not only because they represent potential non-uniformities in the coating process, but also because they can further lead to unstable situations by altering the release of coating material and negatively impact processing throughput.

Although the problem of arc occurrences has been well known to those skilled in the art, it has been addressed with only limited success. Initially it was common to completely shut down the process and perhaps even clean the chamber before restarting. In other instances, lower processing rates were used to make the occurrences of arcs less frequent. More recently, it has been attempted to divert the arc by quickly shutting off the supply of power to the plasma itself. Unfortunately, most such solutions acted only after damage had been done and thus served to minimize—but not completely avoid—problems in more sensitive processing environments. In order to react as quickly as possible, switch-mode or low energy storage power supplies have also been used for many applications. In spite of the fact that they inherently store less power and thus can be manipulated to minimize the negative effects of such arc occurrences, their use alone has not been sufficient for many processing environments. Interestingly, solutions by components designers have often been utilized without full explanation to those involved in the processing itself. This proprietary nature may have even lead to duplication of efforts and limited progress in understanding the nature of the problem. The development of solutions has primarily been the result of individual effort, not a coordinate approached. One other solution which has been publicly pursued has been the utilization of frequency-oriented components to charge a capacitor and then reverse current to negate the arc itself. Unfortunately this solution may act to increase the current in the arc initially and thus can intensify the problem before solving it. Again, this solution is undesirable especially in refined processing environments.

The present invention acts to minimize and in many instances completely eliminate the occurrence of arcs in even the most demanding processing environments. By providing solutions which have general application, the invention makes numerous solutions possible to achieve the same ends. Through its basic understandings, it thus encompasses a variety of designs and systems as they may be incorporated to solve the problem of arcing. In doing so, the present invention satisfies a long felt need for such capability. Perhaps surprisingly, the invention is based upon aspects which have been readily available to those skilled in the art, but which had not been applied in this manner. While those skilled in the art appreciated that the problem of arcing existed, they apparently did not understand the nature of the problem and therefore conducted attempts to solve the problem which were actually directed away from the direction taken by the present invention. This teaching away from the technical direction taken by the present inventors was perhaps further intensified by the fact that those skilled in the art had often avoided full disclosure of their endeavors. While certain designs may have been founded upon principles similar to those of the present invention, in many instances the lack of public disclosure has resulted in causing those skilled in the art to actually have been taught away from the direction taken by the present invention.

SUMMARY OF THE INVENTION

The present invention discloses both the fundamental understandings and circuitry designs which minimize and in some instances completely eliminate the occurrences of arcs within a DC plasma processing system. It encompasses a variety of embodiments through which current may be immediately stopped or decreased upon the actuator incipient occurrence of an arc and through which the condition giving rise to the potential arc in the first place is negated. In addition, the present invention discloses a technique of periodically refurbishing the plasma so as to avoid potential arcing conditions in the first place. In its preferred embodiment, the invention involves a two stage, tapped inductor which is switched to ground. Upon the occurrence of an arc condition—an actual or incipient occurrence of an arc—the switch is activated and thus the circuitry acts to reverse the voltage applied to the plasma and to thus affirmatively attract electrons from the plasma to dissipate any charge build-up which may give rise to an arcing situation. The invention also discloses techniques for sensing an arc condition as even the incipient occurrence of an arc so that immediate response is possible.

Accordingly it is an object of the invention to avoid the undesirable effects of arcs within a DC plasma processing system. In so doing, the invention has as a goal efficiently reacting to arcs in a manner which minimizes any energy impact of the arc upon the coating process. As part of avoiding undesirable effects on the overall plasma processing system, the invention has as a goal acting in a manner which avoids any quenching of the plasma not only to minimize the effects of the arc, but also to allow restoration of the process with minimum delay. In proposing an efficient design, the present invention has as a further goal to provide a technique which may be easily adapted to existing power supply and plasma processing system designs. It also is disclosed in a fashion of an improved power supply design which is independent of the system and thus may be utilized in other similar types of applications.

As mentioned, a general goal of the present invention is to present a process which can be implemented in a variety of ways. A tapped inductor design is disclosed as only one embodiment. This design has been selected in order to minimize circuitry elements and to cause a variety of refinements in the techniques. Certainly other designs are possible as those skilled in the art would readily understand once they understand the general principles involved. In disclosing embodiments which may be implemented in a variety of ways, it is a goal to encompass a variety of arc detection techniques. In many such designs a goal could include the earliest detection of a potential arc occurrence so as to allow a prompt reaction. In some embodiments, a goal is to immediately stop current flowing through the plasma in a variety of manners.

Yet another general goal is to present an invention which discloses a technique that may be utilized in a preventative mode. As such, a goal is not just to react to arcs which are occurring (or about to occur), but to avoid such occurrences in the first place. Thus a goal is to present general design criteria through which systems can be manipulated to minimize or even avoid arc occurrences in the first place by periodically cleaning or restoring the system or plasma.

Naturally further objects of the invention are disclosed throughout other areas of the specification and claims.

DETAILED DESCRIPTION OF THE PREFERRED EMBODIMENTS

Figure 1:
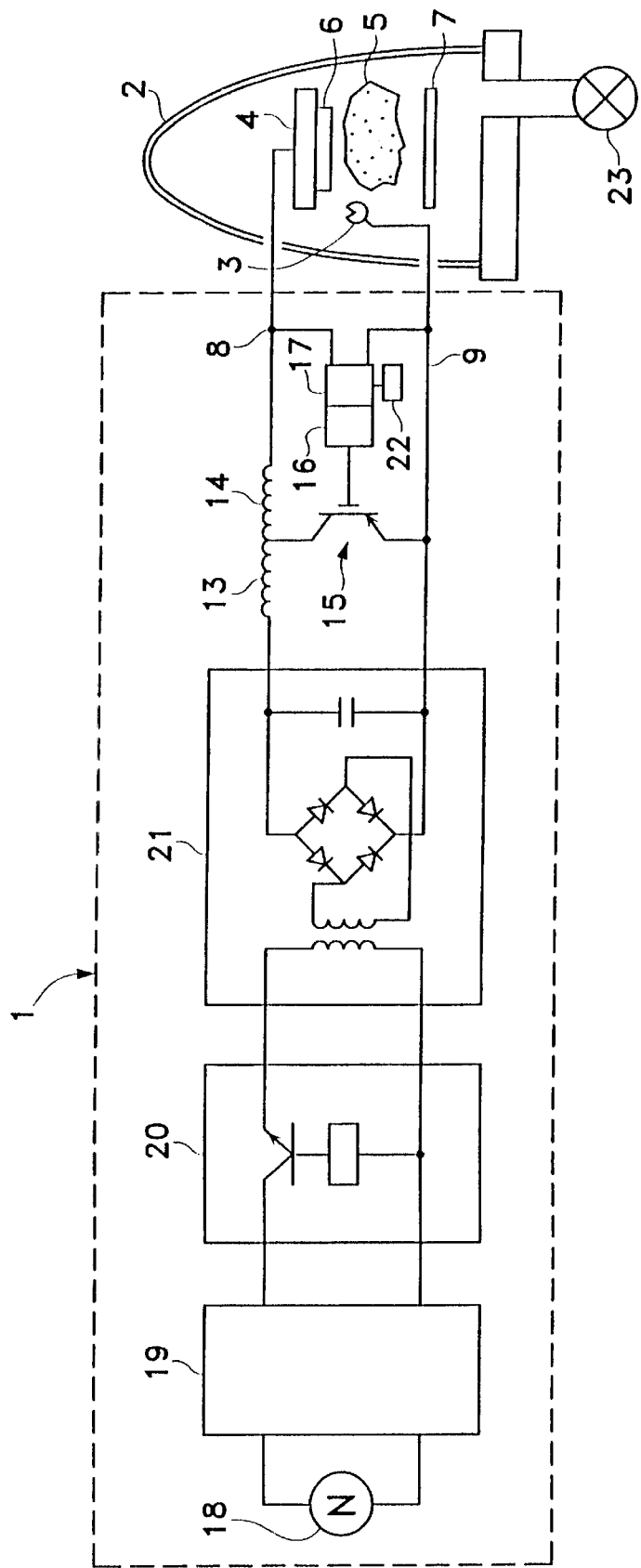
FIG. 1 is a circuit schematic of a processing system including one embodiment of the present invention.

As will be readily understood, the basic concepts of the present invention may be embodied in a variety of ways. Referring to FIG. 1, the tapped inductor embodiment can be readily understood. In general, the DC plasma processing system includes the elements shown in FIG. 1. Specifically, DC power supply (1) is connected to coating chamber (2) within which cathode (4) and anode (3) are contained. In the deposition mode, the DC power supply (1) acts as a means for causing deposition of a coating material by creating an electric potential across cathode (4) and anode (3) to result in plasma (5). Plasma (5) then acts upon material target (6) so as to result in a coating on substrate (7). This coating may be the original target material or it may be the target material combined with some other elements such as reactive gas (23). Thus DC power supply (1) acts as a DC power source providing a direct current power output through first and second leads (8 & 9) into the plasma load to cause deposition.

Figure 2:
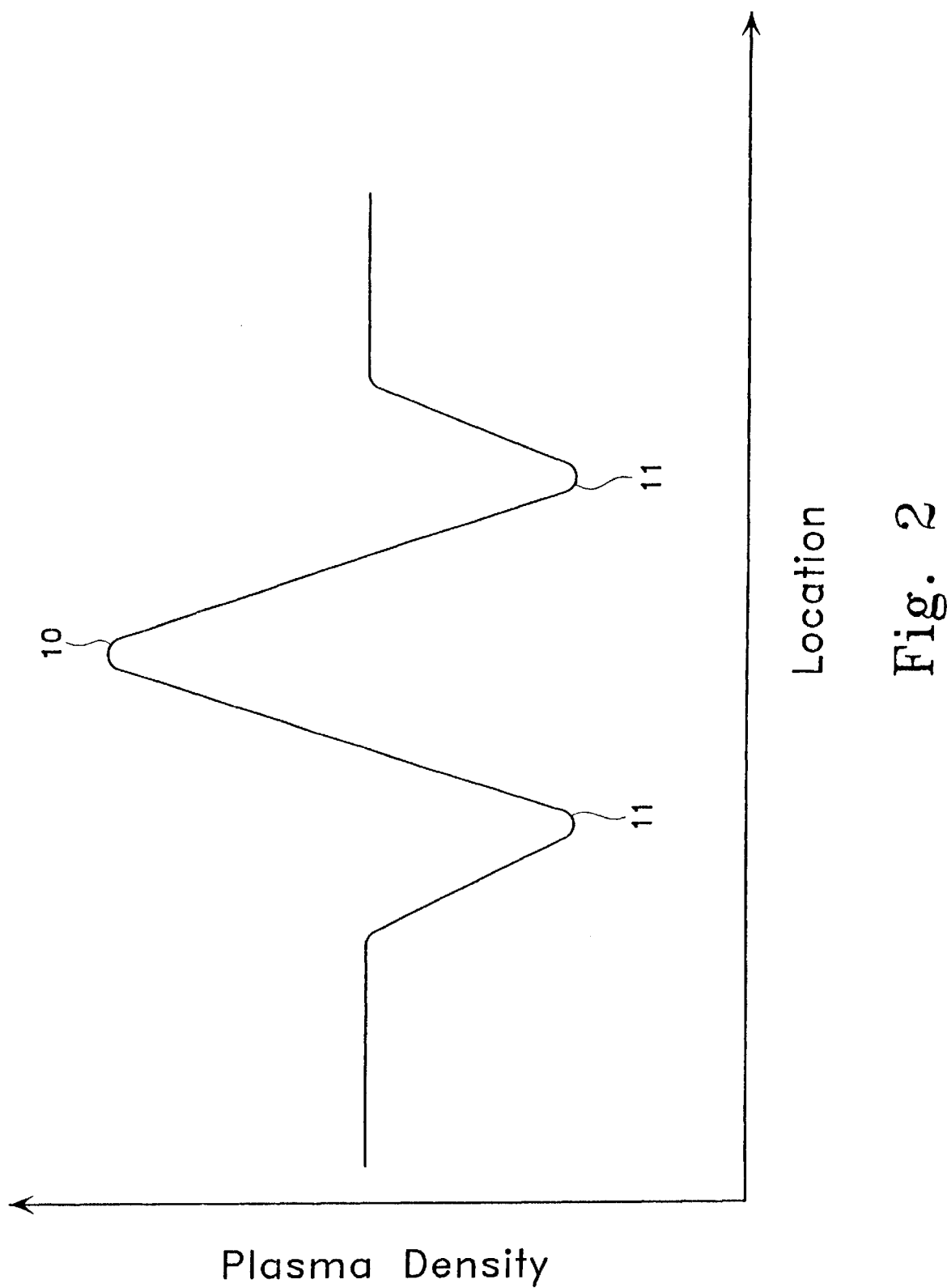
FIG. 2 is a plasma density plot as it may exist at the moment of one type of arc occurrence.

With respect to the problem of arc occurrences, it will be understood that given enough voltage, and sufficient variance in processing environments within coating chamber (2), arc discharges can occur from plasma (5) or cathode (4) to anode (3) and material target (6). Referring to FIG. 2, it can be understood that such discharges may occur either through field variances or when an uneven build-up of charged particles occurs within plasma (5). In FIG. 2 is can be seen that when excess electrons occur (for a variety of reasons known to those skilled in the art) an area prone to electrical conduction may occur. In FIG. 2 this area is referred to as arc location (10). Because of the attraction of neighboring ions to the excess electrons in location (10), the plasma density may be increased in this region, as shown in FIG. 2. These ions may come from neighboring regions (11), and because there is no immediate mechanism to create new ions to replace them, there may be a resulting decrease of ions in these regions (11) as shown in FIG. 2. Of potential importance to the understanding of the present invention for many applications is the fact that the increase in the plasma density in location (10) may, through the mechanism of impact ionization of neutral gas atoms due to the continued instreaming of electrons from the target, quickly increase with time to become the low impedance path known as an arc. Once this occurs, the only mechanism for elimination of the uneven distribution is recombination of the excess ions and electrons, a relatively slow process. To prevent the build-up of ions, the original excess electrons, and therefore the uneven charge distribution in the plasma in locations (10) and (11), must be eliminated before many new ions can be formed. In order to accomplish this, an embodiment of the present invention acts to provide a mechanism for removal of these electrons by attracting them to material target (6). Thus in one embodiment the present invention may further act to immediately prevent any current from flowing, which prevents more electrons from being injected into plasma (5) at location (10), and actually reverses the potential across anode (3) and cathode (4) so that the reverse voltage removes the excess electrons by attracting them to material target (6) and cathode (4), thus eliminating the propensity of an arc to form at arc location (10).

Figure 3B:
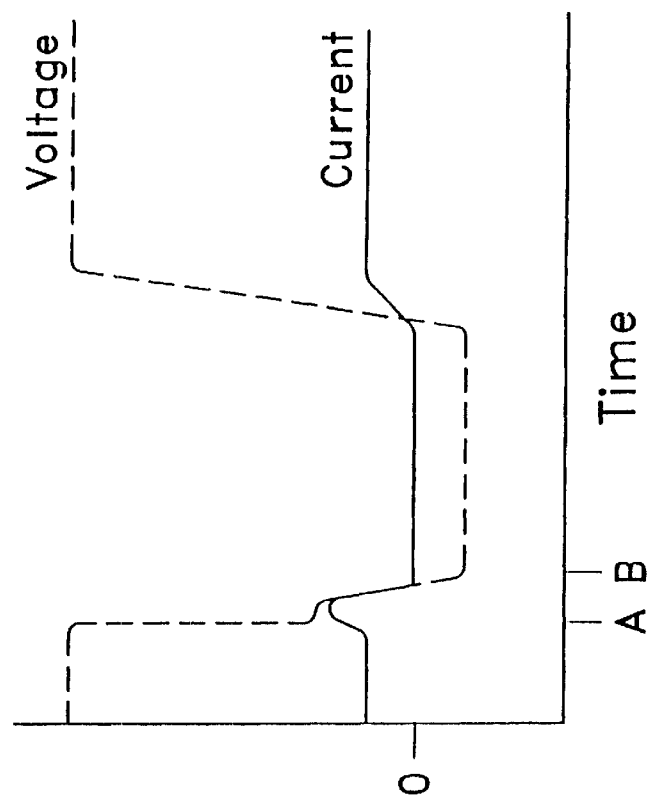
FIG. 3b is a plot showing the relative changes in current and voltage in one embodiment of the invention for a similar type of occurrence.
Figure 3A:
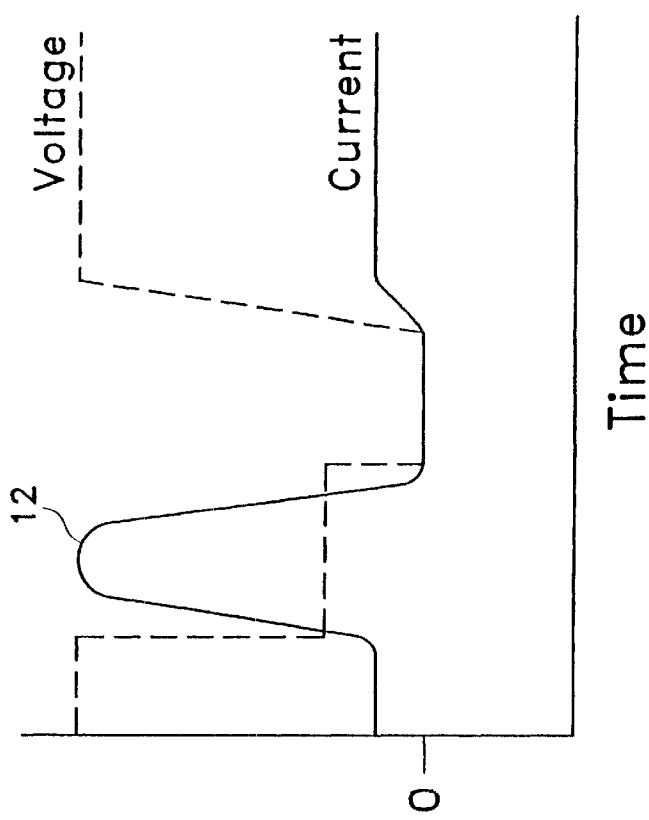
FIG. 3a is a plot showing the relative changes in current and voltage in one prior art design throughout an arc occurrence.

It should be understood that the immediate stopping of current from flowing within an arc is not the equivalent of allowing a discharge of charge build-up or the like to occur through the arc. Referring to FIG. 3a it can be seen in one prior art device how upon the occurrence of an arc, shown by a high current region (12), current flows but is eventually extinguished. While this may happen on the order of microseconds, the amount of energy and disruption to the process is unacceptable. Thus important to one aspect of the present invention is the fact that current is not allowed to flow through the arc. As shown in FIG. 3b, it is immediately stopped or decreased—even within a fraction of a microsecond; this is shown in FIG. 3b. In FIG. 3b, it can be seen upon the incipient occurrence of an arc at time A, the rate of change in the voltage dramatically varies. As will be discussed later with respect to now an incipient arc is sensed, this may be one aspect which gives rises to activation which in one embodiment of the present invention involves a reversal of voltage as shown at time B. This reversal not only acts to immediately stop current from flowing through plasma (5), it also acts to eliminate the uneven build-up of charge within the plasma processing system. This uneven build-up may occur within plasma (5) as discussed with respect to FIG. 2 or may occur on material target (6) or even on some other mask or other element within the processing system. The propensity to arc may also be the result of other anomalies. By reversing voltage, the current is not only immediately stopped, but the conditions giving rise to such a current may be negated. The plasma is thus restored to its net uniform distribution. As shown in both FIGS. 3a and 3b, typical recovery can occur as is known in the art. This may include ramping or reinstating the voltage as shown until current is restored and a steady state condition is resumed.

As can be understood with reference to FIG. 3a, it can be seen that even though the supply of power is effectively switched off in prior art designs, current may not be immediately stopped or decreased. This may be the result of the storage of energy within the power supply circuitry. In order to achieve immediate stoppage or current, any discharge of energy which effects the process must be avoided or minimized. In reactive applications such as that for optical coatings, this may need to occur within fractions of a microsecond.

Referring again to FIG. 1, one embodiment for achieving these ends is disclosed. As can be seen, this embodiment includes an inductor means having first and second inductor portions (13 and 14) connected in series along first lead (8). As may be readily understood, first and second inductor portions (13 and 14) may be arranged in a variety of fashions and may even be designed in transformer configuration. Importantly, these first and second inductor portions (13 and 14) are magnetically coupled. A switch (15) is also connected in between first and second inductor portions (13 and 14) to second lead (9). This switch is controlled by means for activating (16). Means for activating (16) is triggered by means for sensing (17) which acts in a variety of ways to detect an arc condition as the actual presence or incipient presence of an arc occurrence within plasma (5). As can be understood from FIG. 1, upon triggering of switch (15), the voltage applied across plasma (5) is immediately reversed as a result of the inductor means being connected in series along first lead (8). This reversal is one way to cause the immediate stoppage of current through plasma (5). It also acts to clear the plasma of any uneven build-up of charge as discussed earlier. Voltage may naturally be reversed through a variety of other manners and still be considered an equivalent of the present invention including but not limited to supplying another power supply output or switching to reverse voltage, and the like.

With respect to the variation in such designs which fall within the spirit and scope of the present patent, it should be understood that a large degree of variation within inductor means is possible. First, it is possible that inductor means not be included at all. In such an embodiment, switch (15) would act to short out plasma (5). While this may not apply a reverse voltage as desired in one embodiment, it may be sufficient to cause immediate stoppage of current through plasma (5). In addition, second inductor portion (14) may be eliminated. Again, in such an embodiment no reverse voltage might occur, however, given proper system design, immediate stoppage of current through plasma (5) might also occur in this design. In such a design, the inclusion of first inductor portion (13) may still serve a valuable purpose. When switch (15) is activated, having a large first inductor portion (13) would serve to provide sufficient load to DC power supply (1) so that this immediate change in load would not cause undue stress to power supply (1). In reference to the size of first inductor portion (13) such would be considered "large" within the context of this invention so long as the inductance of first inductor portion (13), which combined with the impedance of switch (15), and the power supply output impedance would result in a time constant sufficiently larger than the amount of time the switch would be left on. As those skilled in the art would readily understand, this type of configuration would cause power supply to remain sufficiently loaded and unstressed throughout the time switch (15) were activated. For many applications this is believed to be about ten to twenty microseconds.

In order to reverse the voltage as discussed with reference to FIG. 3b, second inductor portion (14) should not only be magnetically coupled to first inductor portion (13), but it should also have a turns ratio of at least about 10% of that of first inductor portion (13). In such a fashion, the turns ratios would dictate the magnitude of the reverse voltage. Such a substantial reverse voltage is desired—namely that of at lest about 10% of the steady state voltage, a turns ratio of at least about 10% would achieve the goals mentioned earlier. Naturally other inductor geometries and even other components could be used in an equivalent fashion and would still fall within the scope of this patent. Not only should the reverse voltage be at least enough to quickly clear the undesirable condition, it should not be so large as to risk reigniting an arc. It might also not be so large as to drive the plasma in a reverse mode for some applications. Naturally, these limiting values will vary depending upon application, but for the applications presently contemplated, it is believed the claimed limits are adequate. Note that it may be possible that some existing designs which shut off the power supply might presently achieve a slight voltage reversal. This slight voltage reversal is merely an incident of particularly circuit designs and would not be the substantial voltage reversal desired for the present invention in order to achieve elimination of the uneven charge build-ups. In addition, the design of switch (15) would be preferably of the non-latching type so as to allow easy opening of switch (15) to stop the reversal. This may occur before the plasma is quenched—about ten to one hundred microseconds in many processes. With respect to particular designs of switch (15) it has been found that integrated gate bipolar transistors, field effect transistors, darlington bipolar transistors and regular bipolar transistors are adequate, however, the integrated gate bipolar transistors affords easier control in the present configuration.

Referring to FIG. 3b, it can be seen that the earliest sensing of an arc occurrence is desirable. In the embodiment shown in FIG. 1, it is shown that means for sensing (17) acts to sense conditions as close to plasma (5) as possible. In so doing, more accurate readings naturally occur. Through proper configuration as those skilled in the art would readily understand, a variety of sensing decisions can be utilized. As shown in FIG. 3b, a combination of both a high rate of change in the output voltage or current and a low output voltage or current itself may be utilized. In the preferred embodiment, it has been found that using both a voltage value and a rate of change of voltage value reliably indicates incipient are occurrences at the earliest possible time. With respect to the voltage value, either some specific voltage drop such as 200 volts or some percentage voltage drop such as 40% may be utilized. Naturally the percentage determination may vary be application, but it is believed that a low voltage of about 40% to 50% of the nominal output of the supply provides adequate performance in many applications. In addition, other designs are certainly possible including circuits which "cock" when the output voltage or current rises above some level and then "fire" when it subsequently drops back below that level are also possible. Again, while this novel detection technique is conceptually founded, the actual values might be experimentally determined for the particular systems involved.

Referring again to FIG. 1, it can be understood how a particular power supply might be modified to accomplish the goals of the present invention. As those skilled in the art would readily understand when a switch mode power supply were involved the DC power supply (1) may include a means for accepting alternating power (18). This alternating power is at a predominant frequency and would then be converted through means for converting (19) into direct current power. A means for switching (20) would then be included as known to create an alternating signal at a higher frequency. This alternating signal wold then be retransformed to a DC output through means for rectifying (21). With respect to FIG. 1, while some conceptual elements are shown within means for switching (20) and means for rectifying (21) these are for visual understanding only. They do not limited the scope of the devices deemed to fall within the scope of this patent since such aspects are well known in the art. To modify the power supply, the inductor means including first and second portions (13 and 14), switch (15), and the control means shown and discussed earlier would be included within DC power supply (1). Thus DC power supply would not only supply a voltage, it would include a means for analyzing the output or a voltage and a means for immediately stopping current from flowing through its load. Through inclusion of second inductor portion (14) having a turns ratio of at least about 10% of the turns ratio first inductor portion (13), this modified power supply would include a means for applying a reverse voltage to the load. When utilized in a DC plasma processing system, the power supply itself would thus furnish direct current power to cause deposition of a coating material and would have a design that might connect first and second leads to achieve its end.

In addition, such a power supply and system could be operated in a preventive mode through which plasma (5) could be periodically cleared (for examples such as every 10 microseconds to every 2000 microseconds) of any uneven build-up of charged particles by applying a substantial reverse voltage. This periodic clearing might occur as frequently as every one half to two milliseconds again depending upon the particular process involved as discussed earlier. By providing some timer (22) to activate switch (15), a means for periodically clearing plasma (5) could be achieved as those skilled in the art would readily understand.

The foregoing discussion and the claims which follow describe preferred embodiments of the present invention. Particularly with respect to the claims it should be understood that changes may be made without departing from their essence. In this regard, modifications and changes falling within the scope of this patent are not limited by the disclosure. All modifications and changes known to those skilled in the art to achieve the desires of this invention and others which use substantially the same means in substantially the same way to achieve substantially the same result are intended to fall within the scope of this patent. It simply is not practical to describe and claim all possible revisions to the present invention which may be accomplished. To the extent, each fall within the breadth of protection encompassed by this patent. This is particularly true for the present invention since its basic concepts and understandings are fundamental in nature and can be broadly applied.

We claimed:

1. A method of enhanced thin film processing in a plasma system comprising the steps of:
   a. supplying a target material within a coating chamber;
   b. furnishing direct current power to said coating chamber through a circuit having a first and second lead to create a plasma through which current flows;
   c. causing deposition of a thin film of coating material upon a substrate through action of said plasma; and periodically clearing said system of an uneven buildup of charged particles approximately every 10 microseconds to every 2000 microseconds without quenching said plasma.

2. A method of enhanced thin film processing as described in claim 1 wherein said step of periodically clearing comprises the step of applying a reverse voltage.

3. An enhanced DC plasma processing system comprising:
   a. a coating chamber having an anode and a cathode;
   b. a material target disposed to expose coating material within said chamber;
   c. A DC power source wherein said DC power source has a direct current power output and first and second leads which are connected across a plasma to establish a circuit through which current flows; and
   d. a timer which causes periodic clearing of said system of an uneven buildup of charged particles approximately every 10 microseconds to every 2000 microseconds without quenching said plasma.

4. An enhanced DC plasma processing system as described in claim 3 and further comprising reversing circuitry which applies a reverse voltage to said coating chamber.

* * * * *